US006538890B2

(12) United States Patent
Kodaka et al.

(10) Patent No.: US 6,538,890 B2
(45) Date of Patent: Mar. 25, 2003

(54) HEAT SINK ELEMENT AND HIGH-FREQUENCY ELECTRONIC CIRCUIT SUBSTRATE USING SUCH

(75) Inventors: Choichirou Kodaka, Minamiakita-gun (JP); Masahiro Shindo, Akita (JP); Tadashi Ito, Akita (JP)

(73) Assignee: Kokusai Denki Engineering Co., Ltd. (JP)

( * ) Notice: Subject to any disclaimer, the term of this patent is extended or adjusted under 35 U.S.C. 154(b) by 0 days.

(21) Appl. No.: 10/006,676

(22) Filed: Dec. 10, 2001

(65) Prior Publication Data

US 2002/0071252 A1 Jun. 13, 2002

(30) Foreign Application Priority Data

Dec. 12, 2000 (JP) ........................................ 2000-377561

(51) Int. Cl.[7] .................................................. H05K 7/20
(52) U.S. Cl. ........................ 361/704; 257/706; 361/719
(58) Field of Search .................................. 257/276, 706, 257/712, 713; 361/704, 707–712, 717–719; 174/16.3; 165/80.3, 185; 330/251, 277, 289; 343/700 MS, 789, 853, 873

(56) References Cited

U.S. PATENT DOCUMENTS

| 3,717,813 A | * | 2/1973 | Lieberman et al. ........... 455/4.1 |
| 4,672,328 A | * | 6/1987 | Adachi et al. ............... 330/286 |
| 5,216,569 A | * | 6/1993 | Brookhiser .................. 361/107 |
| 5,917,393 A | * | 6/1999 | Kupiszewski et al. ....... 335/216 |

FOREIGN PATENT DOCUMENTS

| JP | 56-169573 U | 12/1981 |
| JP | 7-17156 Y2 | 4/1995 |

* cited by examiner

Primary Examiner—Gerald Tolin
(74) Attorney, Agent, or Firm—Nixon Peabody LLP; Jeffrey L. Costellia

(57) ABSTRACT

A heat sink element in the form of a coil with a high thermal conductivity is formed. One end of the heat sink element is directly connected to a circuit element connection conductor under a high potential in a high-frequency circuit mounted on an electronic circuit substrate, and the other end thereof is directly secured to a metal case having the electronic circuit substrate contained therein. As a result, the heat sink element serves as a heat channel transferring the heat generated due to the temperature increase in the circuit element connection conductor to the metal case by means of thermal conductivity.

6 Claims, 2 Drawing Sheets

PRIOR ART

HEAT SINK ELEMENT AND HIGH-FREQUENCY ELECTRONIC CIRCUIT SUBSTRATE USING SUCH

BACKGROUND OF THE INVENTION

1. Field of the Invention

The present invention relates to a heat sink element for decreasing the temperature of high-temperature portions of high-frequency electronic circuit substrates in electronic devices or wireless communication devices. More specifically, the present invention relates to a heat sink element which is directly connected to a high-potential printed wiring conductor having a circuit element connected thereto and decreasing the temperature by means on thermal conductivity. Furthermore, the present invention also relates to a high-frequency electronic circuit substrate using such heat sink element.

2. Description of the Related Art

A variety of heat sink means or cooling means have been employed in electronic devices or communication devices to suppress the increase in internal temperature caused by operation of the electronic devices or high-frequency signal operation of communication devices. For example, electric fans or heat sink plates have been used as such means. In the field of wireless communication devices, heat sink sheets such as silicon sheets were bonded to high-temperature parts, or circuit substrates were fixed to a metal case with a plurality of metal screws to remove heat in small radios.

With such conventional heat sink means or cooling means, in most cases, the heat of grounded conductors with a zero potential in internal electric or electronic circuits was withdrawn by direct thermal conductivity, whereas an indirect heat removal by convection of air created by a fan was used to decrease the temperature of high-potential zones (hot zones) in signal lines of circuits. However, miniaturization of devices, decrease in their weight, and reduction of cost placed a limitation on the heat withdrawal capacity of such indirect heat removal method and a demand arose for new heat sink means.

For example, in case of high-frequency electronic circuit substrates between antennas and transmission power amplifiers (abbreviated as PA hereinbelow) with a small size and a high output (e.g., 50W) in VHF-band radios (transceivers), or matched filter substrates such as LPF (low-pass filter) substrates with π-type two-stage configuration suppressing spurious emission, if a high-level high-frequency signal is applied to a capacitor and coil of the filter element, the power loss is 2–3 W even if the insertion loss is about 0.1 dB, and such power loss causes heat generation. Temperature increase due to such heat generation could exceed the quality assurance temperature (for example, 105° C.) for printed substrates having a filter mounted thereon and a melting point (for example, about 180° C.) of eutectic solders securing the coil or capacitor and reach about 200° C., leading to degradation of substrate characteristics and separation of components.

FIG. 4 illustrates a circuit of a conventional π-type two-stage LPF. $L_1$ and $L_2$ are spiral coils obtained by winding a single wire with a diameter of about 1 mm to obtain an inner diameter of 3 mm. The number of turns in the coils is about 3t. Furthermore, $C_1$, $C_2$, $C_3$ are ceramic capacitors with Q of about 150–200. Q-high capacitors may be used to decrease the insertion loss, but such capacitors increase the cost by a factor of 30–50. Moreover, $3a$, $3b$, $3c$ are high-potential printed wiring conductors.

The increase in temperature caused by heat generation in such matched filter substrates is the highest in the zone of series elements of a high-frequency signal line (high-potential side). The problem is, however, that all of the conventional heat sink means are practically ineffective for suppressing temperature increase at a high-potential side. Furthermore, the PA components are introduced into a metal package for heat removal, brought in flat surface contact with a case, and secured with a large number of screws. However, since the matched filter substrates serve as antenna connection circuits and have a miniaturized structure, they cannot be placed in the PA package. As a result, substrate characteristics are degraded and components are damaged due to a temperature increase. The only way to avoid such degradation is to decrease the transmission power, which becomes a weak point of transmitters.

Accordingly, a demand was created for heat sink elements capable of effectively decreasing the temperature of high-temperature components under a high potential in matched filter substrates or high-frequency electronic circuit substrates without using conventional heat removal means, and for circuits using such heat sink elements.

SUMMARY OF THE INVENTION

The heat sink element in accordance with the present invention is in the form of a coil obtained by spirally winding a wire with a high thermal conductivity, one end of the coil being directly connected to a high-potential circuit element connection conductor in a high-frequency circuit mounted on an electronic circuit substrate and the other end of the coil being directly secured to a metal case having the electronic circuit substrate contained therein, and serves as a heat channel for transferring the heat caused by temperature increase in the circuit element connection conductor to the metal case by means of thermal conductivity.

Another heat sink element in accordance with the present invention is in the form of a monolayer cylindrical coil obtained by spirally tightly winding a wire with a high thermal conductivity, one end of the monolayer cylindrical coil being directly connected to a high-potential circuit element connection conductor in a high-frequency circuit mounted on an electronic circuit substrate and the other end of the monolayer cylindrical coil being directly secured to a metal case having the electronic circuit substrate contained therein, and serves as a heat channel for transferring the heat caused by temperature increase in the circuit element connection conductor to the metal case by means of thermal conductivity. The inductance of the monolayer cylindrical coil determined by the coil radius and the number of turns is set such that it gives a sufficiently high impedance by comparison with the impedance at the operation signal frequency of the circuit element connection conductor portion to which one end of the monolayer cylindrical coil is connected, so as to produce no effect on characteristics of the high-frequency circuit.

Another heat sink element in accordance with the present invention is in the form of a monolayer cylindrical coil obtained by spirally tightly winding an insulator-coated copper wire, one end of the monolayer cylindrical coil being directly connected to a high-potential circuit element connection conductor in a high-frequency circuit mounted on an electronic circuit substrate and the other end of the monolayer cylindrical coil being directly secured to a metal case having the electronic circuit substrate contained therein, and serves as a heat channel for transferring the heat caused by temperature increase in the circuit element connection conductor to the metal case by thermal conductivity. The inductance of the monolayer cylindrical coil determined by the coil radius and the number of turns is set such that it gives a sufficiently high impedance by comparison with the impedance at the operation signal frequency of the circuit element connection conductor portion to which one end of the monolayer cylindrical coil is connected, so as to produce no effect on characteristics of the high-frequency circuit.

The high-frequency electronic circuit substrate in accordance with the present invention has a high-frequency circuit mounted thereon, is connected between an output terminal of a transmission power amplifier and an antenna, and is contained in a metal case, wherein heat channel means for transferring the heat caused by the temperature increase in a circuit element connection conductor which connects high-potential circuit elements of the high-frequency circuit to the metal case by thermal conductivity is provided between the circuit element connection conductor and the metal case. A heat sink element in the form of a coil obtained by spirally winding a wire with a high thermal conductivity and having one end thereof directly connected to the circuit element connection conductor and the other end thereof directly secured to the metal case, is used as heat channel means.

Furthermore, the high-frequency electronic circuit substrate in accordance with the present invention has a high-frequency circuit mounted thereon, is connected between an output terminal of a transmission power amplifier and an antenna, and is contained in a metal case, wherein heat channel means for transferring the heat caused by the temperature increase in a circuit element connection conductor which connects high-potential circuit elements of the high-frequency circuit to the metal case by thermal conductivity is provided between the circuit element connection conductor and the metal case. A heat sink element in the form of a monolayer cylindrical coil obtained by spirally tightly winding a wire with a high thermal conductivity, one end thereof being directly connected to the circuit element connection conductor and the other end thereof being directly secured to the metal case, is used as heat channel means. The inductance of the heat sink element is determined by the coil radius and the number of turns of the monolayer cylindrical coil. Thus, the inductance of the heat sink element is set such that it gives a sufficiently high impedance by comparison with the impedance at the operation signal frequency of the circuit element connection conductor portion to which one end of the monolayer cylindrical coil is connected, so as to produce no effect on characteristics of the high-frequency circuit.

Moreover, the high-frequency electronic circuit substrate in accordance with the present invention has a high-frequency circuit mounted thereon, is connected between an output terminal of a transmission power amplifier and an antenna, and is contained in a metal case, wherein heat channel means for transferring the heat caused by the temperature increase in a circuit element connection conductor which connects high-potential circuit elements of the high-frequency circuit to the metal case by thermal conductivity is provided between the circuit element connection conductor and the metal case. A heat sink element in the form of a monolayer cylindrical coil obtained by spirally tightly winding an insulator-coated copper wire, one end thereof being directly connected to the circuit element connection conductor and the other end being directly secured to the metal case, is used as heat channel means. Thus, the inductance of the heat sink element determined by the coil radius and the number of turns is set such that it gives a sufficiently high imedance by comparison with the impedance at the operation signal frequency of the circuit element connection conductor portion to which one end of the monolayer cylindrical coil is connected, so as to produce no effect on characteristics of the high-frequency circuit.

DESCRIPTION OF THE PREFERRED EMBODIMENT

Figure 1:
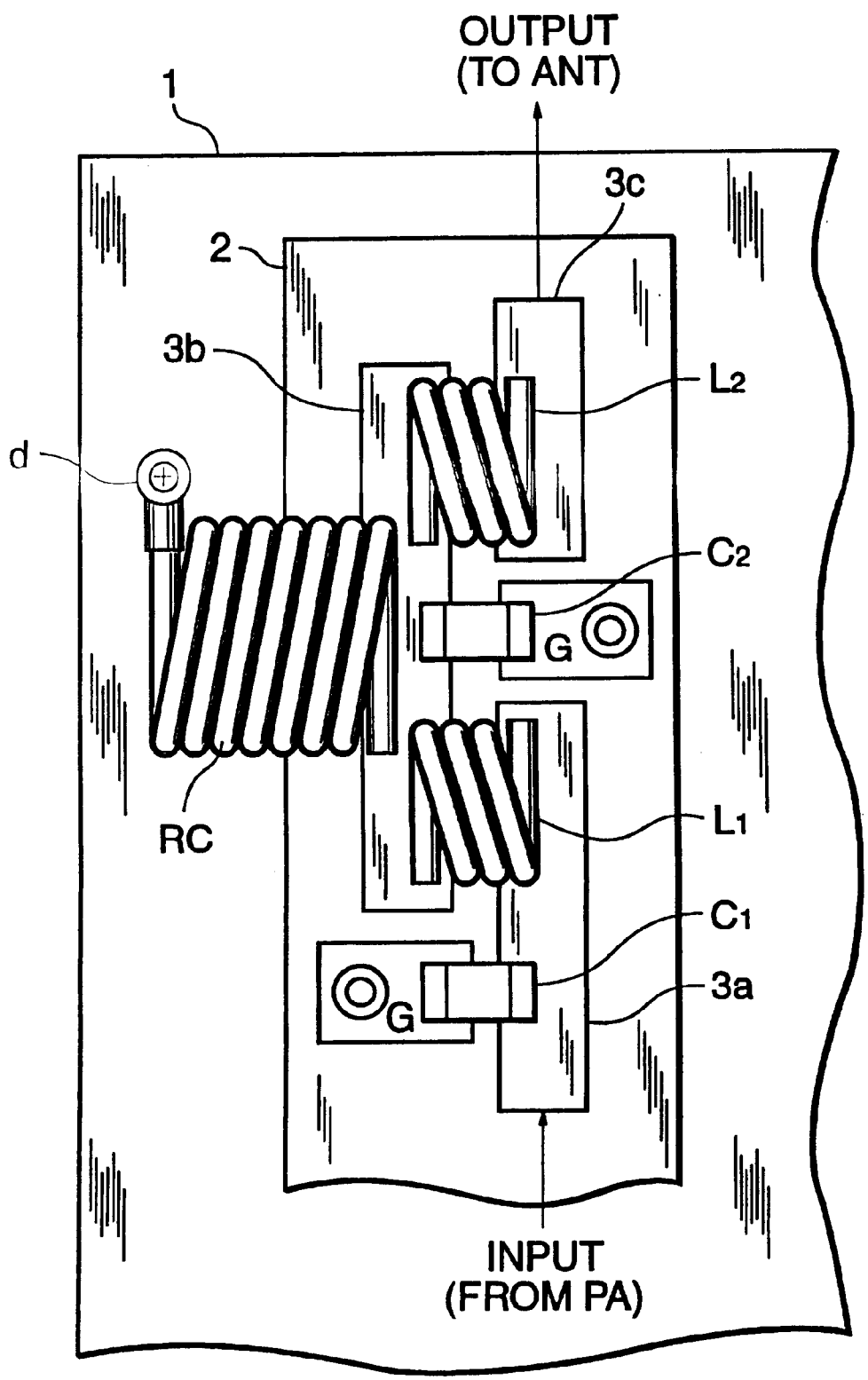
FIG. 1 is a plan view illustrating the structure of the first embodiment of the present invention.
Figure 2:
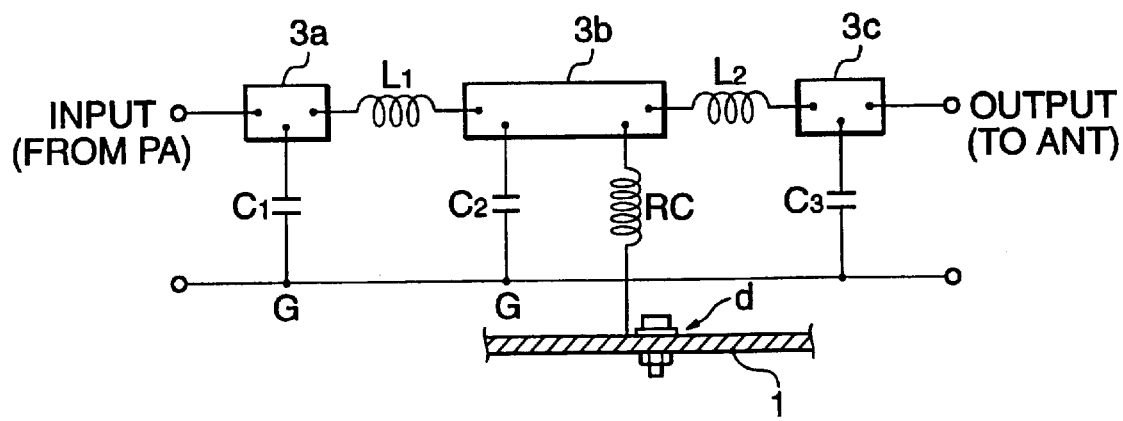
FIG. 2 illustrates an example of the circuit of the first embodiment of the present invention.
Figure 4:
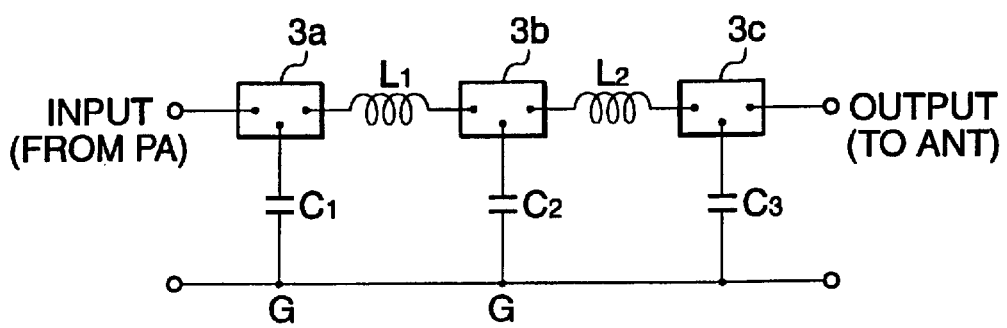
FIG. 4 illustrates an example of the circuit of the conventional LPF.

FIG. 1 is a plan view illustrating the first embodiment of the present invention. FIG. 2 illustrates an example of the circuit of the present embodiment. In the figure, coils $L_1$, $L_2$ which are the serial elements of a LPF (low-pass filter) and capacitors $C_1$, $C_2$, $C_3$ which are the parallel elements are identical to the conventional structural elements shown in the above-described FIG. 4. Capacitor $C_3$ is not shown in FIG. 1.

Reference numeral 1 in FIG. 1 stands for a metal case, reference numeral 2 stands for a printed substrate (high-frequency electronic circuit substrate), reference numeral 3 (3a, 3b, 3c) stands for high-potential printed wiring conductors, reference symbol RC stands for a heat sink coil (radiation coil) which is a heat sink element (or of heat sink device) of the present invention, and reference symbol d stands for a contact point of heat sink element RC and case 1. Printed wiring conductor 3a is a conductor connecting coil $L_1$ which is a serial element and capacitor $C_1$, which is an input parallel element. Furthermore, printed wiring conductor 3b is a conductor connecting coils $L_1$, $L_2$ which are the two serial elements, capacitor $C_2$, and heat sink element RC. Printed wiring conductor 3c is a conductor connecting output coil $L_2$ and capacitor $C_3$. One end of heat sink element RC is connected to printed wiring conductor 3b, and the other end thereof is connected to case 1. In the present embodiment, the other end of heat sink element RC is secured by screwing to case 1 in the connection point d.

The heat sink element RC has a function of directly withdrawing heat from the portion of the high-frequency electronic circuit substrate 2, where the increase in temperature is the highest, to metal case 1 by means of thermal conductivity, and a metal material with a higher thermal conductivity, for example, copper is used therefor. The heat sink element RC of the present embodiment illustrated by FIG. 1 and FIG. 2 is a monolayer cylindrical coil obtained by tightly spirally winding a copper wire.

When a high-frequency electronic circuit substrate, in which a high-frequency circuit such as an LC filter mounted on a printed substrate, is actuated by a high-power high-frequency signal, a portion in which the temperature rises due to loss in each element is under a high potential. When a filter is mounted, parallel elements and wiring conductors in zones connected thereto have an especially high temperature. By contrast, in the grounded zones, the surface area of printed conductor is large and heat can be easily removed therefrom, for example, by the attachment screws which are in contact with the case.

Here, removal of heat from the above-mentioned high-temperature parts under a high potential may be conducted by providing a large-diameter copper wire or band-like copper sheet as a direct bridge between the printed wiring conductor which is under a high potential and the case, if the operation of the high-frequency circuit is ignored and only heat radiation is taken into Account. However, the high-frequency circuit is thereby made inoperable. For this reason, in accordance with the present invention, in order to withdraw the heat, without affecting the circuit operation, the copper wire of heat sink element RC is made in the form of a coil which is provided with choke coil characteristic, that is, a characteristic of passing direct current and relatively low frequencies, but blocking electric current of a relatively high frequency. Therefore, the inner diameter and number of turns in the coil were set so that the inductance thereof gives an impedance that is sufficiently high by comparison with the impedance at the operation signal frequency of the element connection point which is a high-temperature part. For example,;it was confirmed that no effect is produced on filter characteristics, if the setting is 600–700 nH when the operation frequency is within a 150 MHz band and if the setting is 200–300 nH when the operation frequency is within a 450 MHz band.

Furthermore, in order to further improve thermal conductivity of heat sink element RC, the heat sink element RC is obtained by tight winding and an insulator coated copper wire, for example polyester-coated copper wire with a high heat resistance index was used. The size of the entire heat sink element RC was set so as to use effectively the volume of the hollow portion in the vicinity of parts generating heat inside the case 1. This size was confirmed experimentally.

Taking the above-described electric and physical properties into account, in the heat sink element RC in accordance with the present invention, for example, a polyester-coated copper wire with a diameter of 1.4 mm$\phi$ is used to obtain a monolayer, tightly wound coil with an inner diameter of about 5 mm$\phi$ containing 7$t$ turns. One end of the coil was fixed by soldering to printed wiring conductor 3$b$ which is a connection part of the two serial coils $L_1$, $L_2$ of the filter and parallel capacitor $C_2$. The other end of the coil was fixed by screwing to the connection point d of case 1. It goes without saying that the method for fixing both ends shall provide for connection maximizing the contact surface area so as to produce no adverse effect of thermal conductivity.

Heat in the high-temperature portions of the high-frequency circuit substrate is transferred by the above-described heat sink element RC to case 1 with heat sink means looking like a cylindrical copper tube because of tight winding of the heat sink element RC, and the heat is removed with a very high efficiency. As a result, though within the framework of the conventional technology which uses no heat sink element RC of the present invention the temperature was rising up to about 200° C. at which the solder of the printed substrate is melted, the installation of the heat sink element RC in accordance with the present invention made it possible to suppress the temperature increase to less than about 100° C. The quality assurance temperature of the printed substrate was thus satisfied and the desired operation of high-power transmitted was conducted.

Figure 3:
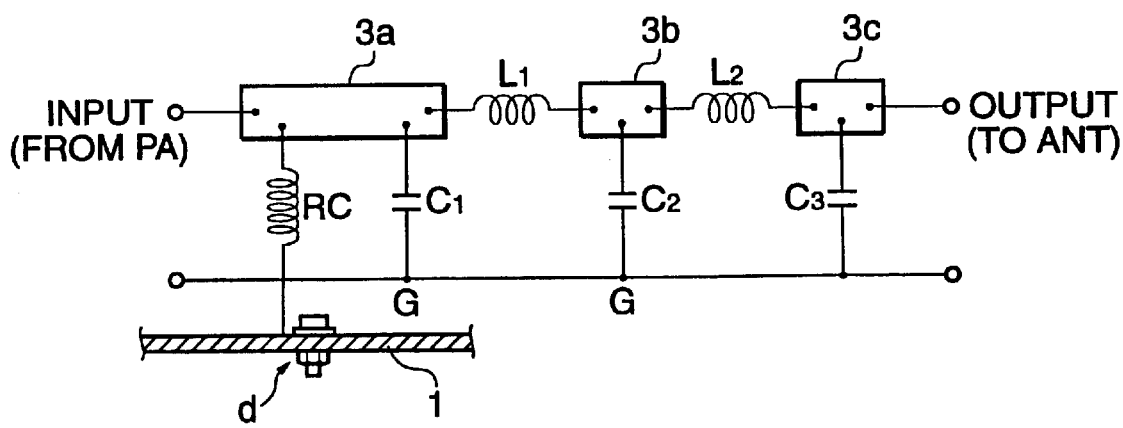
FIG. 3 illustrates an example of the circuit of the second embodiment of the present invention.

The second embodiment of the present invention is shown in FIG. 3. FIG. 3 illustrates an example of the circuit of the second embodiment of the present invention. In this example, the heat sink element RC is attached to the input printed wiring conductor 3$a$ of LPF, that is, the output of power amplifier (PA). Other structural components of the present embodiments are identical to those of the above-described first embodiment shown in FIG. 1 and FIG. 2, and therefore are indicated by the same reference letters and numerals.

In the first and second embodiments illustrated by FIGS. 1–3, the explanation was conducted with respect to a π-type two-stage LPF mounted substrate of a high-frequency stage. The present invention is, however, not limited to the filter, can be applied as means suppressing temperature increase in high-frequency circuit substrates in high-frequency power amplifiers operating within a frequency range of higher than about 100 MHz, which are the VHF-band radios, and can provide excellent effect similar to that obtained in the above-described embodiments.

As described in detail hereinabove, the implementation of the present invention makes it possible to suppress temperature increase in an LPF substrate for spurious removal between an antenna (ANT) and a power amplifier in transmitters operating in quality of the printed substrate could be guaranteed, separation of components due to solder melting was eliminated, and the desired transmission power could be maintained.

What is claimed is:

1. A heat sink element in the form of a coil obtained by spirally winding a wire with a high thermal conductivity, one end of said coil being directly connected to a high-potential circuit element connection conductor in a high-frequency circuit mounted on an electronic circuit substrate and the other end of said coil being directly secured to a metal case having said electronic circuit substrate contained therein, this heat sink element serving as a heat channel for transferring the heat caused by the temperature increase in circuit element connection conductor to said metal case by means of thermal conductivity.

2. The heat sink element according to claim 1, wherein said coil is a monolayer cylindrical coil obtained by spirally tightly winding said wire, and the inductance determined by the coil radius and the number of turns is set such that it gives a sufficiently high impedance by comparison with the impedance at the operation signal frequency of the circuit element connection conductor portion to which one end of said monolayer cylindrical coil is connected, so as to produce no effect on characteristics of the high-frequency circuit.

3. The heat sink element according to claim 1, wherein said coil is a monolayer cylindrical coil obtained by spirally tightly winding an insulator-coated copper wire produced by using a copper wire as said wire and coating an insulating material on said copper wire, and the inductance determined by the coil radius and the number of turns is set such that it gives a sufficiently high impedance by comparison with the impedance at the operation signal frequency of the circuit element connection conductor portion to which one end of said monolayer cylindrical coil is connected, so as to produce no effect on characteristics of the high-frequency circuit.

4. A high-frequency electronic circuit substrate having a high-frequency circuit mounted thereon, connected between an output terminal of a transmission power amplifier and an antenna, and contained in a metal case, wherein heat channel means for transferring the heat caused by temperature increase in a circuit element connection conductor to which high-potential circuit elements of said high-frequency circuit are connected to said metal case by thermal conductivity is provided between said circuit element connection conductor and said metal case, and a heat sink element in the form of a coil obtained by spirally winding a wire with a high thermal conductivity, one end thereof being directly connected to said circuit element connection conductor and the other end being directly secured to said metal case, is used as heat channel means.

5. The high-frequency electronic circuit substrate according to claim 4, wherein said heat sink element is in the form of a monolayer cylindrical coil obtained by spirally tightly winding said wire, and the inductance determined by the coil radius and the number of turns is set such that it gives a sufficiently high impedance by comparison with the impedance at the operation signal frequency of the circuit element connection conductor portion to which one end of said monolayer cylindrical coil is connected, so as to produce no effect on characteristics of the high-frequency circuit.

6. The high-frequency electronic circuit substrate according to claim 4, wherein said heat sink element is in the form of a monolayer cylindrical coil obtained by spirally tightly winding an insulator-coated copper wire produced by coating an insulating material on a copper wire used as said wire, and the inductance determined by the coil radius and the number of turns is set such that it gives a sufficiently high impedance by comparison with the impedance at the operation signal frequency of the circuit element connection conductor portion to which one end of said monolayer cylindrical coil is connected, so as to produce no effect on characteristics of the high-frequency circuit.

* * * * *